United States Patent
Bell

(10) Patent No.: US 8,933,585 B2
(45) Date of Patent: Jan. 13, 2015

(54) METERING OPTIMAL SAMPLING

(71) Applicant: Utilidata, Inc., Providence, RI (US)

(72) Inventor: David Bell, Spokane, WA (US)

(73) Assignee: Utilidata, Inc., Providence, RI (US)

( * ) Notice: Subject to any disclaimer, the term of this patent is extended or adjusted under 35 U.S.C. 154(b) by 0 days.

(21) Appl. No.: 14/266,509

(22) Filed: Apr. 30, 2014

(65) Prior Publication Data

US 2014/0319912 A1  Oct. 30, 2014

Related U.S. Application Data

(60) Provisional application No. 61/817,751, filed on Apr. 30, 2013.

(51) Int. Cl.
| | |
|---|---|
| H02J 1/00 | (2006.01) |
| H02J 3/14 | (2006.01) |
| H02J 3/00 | (2006.01) |
| G01D 4/00 | (2006.01) |

(52) U.S. Cl.
CPC .. *H02J 3/00* (2013.01); *G01D 4/004* (2013.01)
USPC .......................................................... 307/31

(58) Field of Classification Search
USPC ........... 307/31; 700/297, 298; 702/60–62, 64, 702/79, 106, 108; 340/870.02
See application file for complete search history.

(56) References Cited

U.S. PATENT DOCUMENTS

| | | | |
|---|---|---|---|
| 3,867,950 | A | 2/1975 | Fischell |
| 5,411,537 | A | 5/1995 | Munshi et al. |
| 8,670,876 | B2 | 3/2014 | Bell |
| 2005/0165461 | A1 | 7/2005 | Takeda et al. |
| 2007/0229055 | A1* | 10/2007 | Nishida ...................... 324/76.12 |
| 2009/0265042 | A1* | 10/2009 | Mollenkopf et al. ......... 700/298 |
| 2011/0317935 | A1* | 12/2011 | Anan et al. .................... 382/274 |
| 2013/0110425 | A1* | 5/2013 | Sharma et al. .................. 702/62 |

FOREIGN PATENT DOCUMENTS

GB   1 419 531 A   12/1975

OTHER PUBLICATIONS

International Search Report dated Jun. 20, 2014 for corresponding PCT/US2014/036184.

* cited by examiner

*Primary Examiner* — Rexford Barnie
*Assistant Examiner* — Rasem Mourad
(74) *Attorney, Agent, or Firm* — Foley & Lardner LLP; Christopher J. McKenna; Chethan K. Srinivasa

(57) ABSTRACT

The present disclosure is directed to providing voltage via a power distribution system. A computing device receives delivered voltage information from metering devices metering power distributed to sites by a controller. The computing device determines a number of metering devices to use to generate a control signal to control operation of the controller. The number can be determined based on the delivered voltage information for each site. The computing device selects, based on the delivered voltage information, at least the determined number of metering devices to form a subset of metering devices for a subset of sites. The computing device uses the delivered voltage information of the subset of metering devices to generate the control signal. The control signal can control operation of the at least one controller distributing power to the plurality of sites.

22 Claims, 10 Drawing Sheets

METERING OPTIMAL SAMPLING

CROSS-REFERENCE TO RELATED APPLICATIONS

This application claims the benefit of priority under 35 U.S. §119 to U.S. Provisional Patent Application No. 61/817,751, filed Apr. 30, 2013, which is incorporated by reference herein in its entirety.

TECHNICAL FIELD

The disclosure relates to electrical power distribution systems, processes and apparatus and power management in power distribution systems. More particularly, the present disclosure relates to power conservation and selective power regulation in power distribution systems.

BACKGROUND

In electrical power distribution systems, several needs compete and must be simultaneously considered in managing electrical power distribution. A first concern has to do with maintaining delivered electrical power voltage levels within predetermined limits. A second concern relates to overall efficiency of electrical power generation and distribution. A third concern relates to these and other concerns in light of changing electrical loading of the system and variations in the character of the loading. A fourth concern relates to power system management under conditions associated with an increased probability of compromise of large scale ability to deliver appropriate power.

It is generally desirable to manage a power grid to reduce overall power consumption while maintaining adequate delivered voltage minimum and maximum levels across the system. In other words, the voltage levels actually delivered to various users need to be kept within predetermined limits while delivering power efficiently, without undue power loss in the delivery system or power grid, including the power generation equipment. As power usage within the system changes, in accordance with diurnal, weekly and seasonal factors, among others, need for regulation of power distribution changes as well. To an extent, some of these changes are reasonably predictable, however, other aspects of these changes may not be readily predictable.

Predictable changes in system loading are forecast by integrating power demand over time and considering this draw together with other factors, such as increased outdoor temperature and known diurnal variation patterns. For example, when summer heat results in increased power demand for air conditioning during the course of the day, fast food power demand associated with the end of the work day may indicate that a power shortage is imminent. Typically, measurements of power demand and delivered voltage are made every few seconds, filtered to reveal variations with periodicities on the order of a few minutes or longer, and adjustments to voltage are made perhaps once or twice an hour. This is called "conservation voltage reduction" and is intended to reduce overall power demand.

However, compromise of power delivery capability due, for example, to extreme weather conditions (e.g., gale winds affecting the distribution system) or unforeseen decrease in available power (e.g., generator malfunction) is not necessarily amenable to precise forecasting but is observable. As a result, there is need for dynamic system adjustment in response to observed changes in system capacity, conditions and loading.

Increased probability of compromise of large scale ability to deliver appropriate power may include increased probability of system-wide failure or blackout of an area, where "system-wide failure" could mean either a large grid being shut down or a smaller grid being isolated from a larger grid, with a potential result that the smaller grid then would be shut down or malfunction. In some cases, grid failure may be caused by automated shutdown of one or more generators in response to determination of grid conditions ill-suited to the generator in order to obviate catastrophic generator failure.

The conditions associated with an increased probability of compromise of large scale ability to deliver appropriate power are varied, and can range from "brownout" situations to complete disruption of electrical service or "blackouts". Some types of power consumption relate to relatively vital concerns, such as hospitals, infrastructural support systems (telephone, police, fire protection, electrical traffic signals and the like) and others relate to more quotidian concerns, such as air conditioning, fast food operations and industrial operations such as aluminum smelters and the like, as equipment is added to or removed from service, for example.

The latter types of concerns can present a high electrical power demand at certain times of day. However, interruption of power delivery to such operations does not usually present life-threatening consequences when such operations are without electrical power.

Further, in the event of severe disruption or demand, grid systems used for delivery of electrical power can experience catastrophic failure when load conditions presented to generators in the system are such that one or more electrical generators are automatically shut down or disconnected from the system. This situation obviously places increased demand or even less suitable loading conditions on other generators or grids to which the grid is coupled. As a result, other generators or grids coupled to the affected grid may disconnect from the affected grid, potentially resulting in a blackout. Such blackouts can be extremely widespread in electrical generation and distribution systems employed multiple coupled grids each having electrical generation capability.

Electric utility distribution circuits are, generally, subject to both engineering and statutory constraints. For example, customers may expect very high availability of suitable AC voltage, so the electric utility distribution circuits should be reliable. Voltage limits may be specified for the voltage provided by the electric utility distribution circuits. In certain cases, exceptions to these limits also may exist, e.g., due to excess power demand conditions. The limits described so far may be codified by statute or regulation.

Other requirements also may be present, such as engineering requirements of the facilities. Electric utility distribution circuits may require consistency of application of circuit devices and materials in construction. Similarly electric utility distribution circuits may be required to operate consistently with cost effective sustainability, e.g., maintenance must be practical.

Electrical utility distribution circuits may benefit from various practices designed to improve efficiency or other performance metrics. For example, conservation voltage regulation (CVR) is the practice of reducing electrical energy consumption by operating electric distribution systems at voltages in the a lower portion of an allowable range, thereby improving the efficiency of many electric utilization devices. Many if not all utilization devices operate more efficiently in the lower portion of their designed voltage range. If those devices, motors, drives, electronic power supplies, transformers, lighting systems, etc. are applied properly, that is if they are not undersized for their application, virtually all will operate more efficiently.

In electrical power distribution systems as discussed above, one technique includes the use of an automated metering infrastructure (AMI). The application of automated metering infrastructure as the source of circuit voltage and demand metering in closed loop voltage optimization systems presents a computational problem for such systems. In the simplest case, a single distribution circuit (also referred to as a feeder) controlled by a single bank of voltage regulating transformers or by a single on-load tap changing transformer may serve thousands of electric utility customers. In the present context, each such customer site is assumed to be equipped with a metering device having voltage and demand metering capability, and telemetry capability such that its measurements may be observed by a voltage (or Volt/VAR) optimization system. The problem at hand is to select a subset of said metering devices that may be effectively used to inform the operational decisions of a closed loop voltage optimization system, subject to criteria derived from the performance qualifications of the voltage optimization system.

SUMMARY

At least one aspect of the present disclosure is directed to a method of providing voltage via a power distribution system. In some embodiments, the method includes a computing device receiving delivered voltage information (e.g., a voltage measurement and a sample time associated with the measurement) from each metering device of a plurality of sites. Each metering device meters power distributed to each of the plurality of sites by at least one controller. The method can include determining a number of metering devices to use to generate a control signal to control operation of the at least one controller distributing power to the plurality of sites (e.g., a statistical population including a collection of observations or voltage information from one or more sites). The number can be determined based on the delivered voltage information for each of the plurality of sites. The method can include the computing device selecting at least the determined number of metering devices from the plurality of metering devices to form a subset of metering devices. The subset of metering devices can corresponding to a subset of the plurality of sites. For example, the subset of metering devices can be based on the statistical population including a collection of observations or voltage information from a plurality of metering devices corresponding a plurality of sites. The subset can be selected based on the delivered voltage information. The method can include using the delivered voltage information of the subset of metering devices to generate the control signal. The control signal can control operation of the at least one controller distributing power to the plurality of sites.

In some embodiments, the method can include determining the number of metering devices to use to generate the control signal based on a variance of total delivered voltage (e.g., variance of the delivered voltage population) to the plurality of sites and a variance difference threshold. The total delivered voltage can be based on the delivered voltage information for each of the plurality of sites. In some embodiments, the method can include determining the number of metering devices to use to generate the control signal based on a dispersion of the total delivered voltage to the plurality of sites and an individual dispersion of the delivered voltage information for each of the plurality of metering devices.

In some embodiments, the method can include identifying a total number of metering devices of the plurality of sites. The method can include determining the number of metering devices to use for the subset of metering devices based on a square root of the total number of metering devices.

In some embodiments, the method can include determining a first covariance weighted distance (e.g., a statistical distance) for a total delivered voltage to the plurality of sites. The method can include determining a second covariance weighted distance for each of the plurality of sites based on the delivered voltage information from each of the metering devices. The method can include determining the number of metering devices to use for the subset of metering devices based on the first covariance weighted distance, the second covariance weighted distance, and a variance difference threshold. In some embodiments, the variance difference threshold comprises an error margin for an estimate of a sample-size dependent variance ratio.

In some embodiments, the method includes determining an expected value of the delivered voltage information for each of the plurality of sites. Based on the expected value, the method can include determining the number of metering devices for the subset of metering devices based on the expected value. In some embodiments, the method can include selecting the subset of metering devices that have a lowest expected value of the delivered voltage information.

In some embodiments, the method can include determining a median value for each of the plurality of sites based on the delivered voltage information from each of the metering devices. The method can include selecting one or more metering devices of the plurality of sites that have a lowest median value of the delivered voltage information to form the subset of the metering devices. In some embodiments, the method can include determining a spatial median value for each of the plurality of sites based on the delivered voltage information from each of the metering devices. In some embodiments, the method can include selecting one or more metering devices of the plurality of sites that have a lowest spatial median value to form the subset of the metering devices. In some embodiments, the method can include the computing device transmitting the generated control signal to the at least one controller of the plurality of sites.

Another aspect of the present disclosure is directed to a system to control voltage in a power distribution system. The system can include a computing device having at least one processor. The processor can be configured to receive delivered voltage information (e.g., a voltage measurement and a sample time associated with the measurement) from each metering device of a plurality of sites. The metering devices can be configured to meter power distributed to each of the plurality of sites by at least one controller. The processor can be further configured to determine a number of metering devices to use to generate a control signal. The number can be determined based on the delivered voltage information for each of the plurality of sites. The processor can be further configured to select at least the determined number of metering devices from the plurality of metering devices to form a subset of metering devices. The subset of metering devices can corresponding to a subset of the plurality of sites. The subset of metering devices can be selected based on the delivered voltage information. The processor can be further configured to use the delivered voltage information of the subset of metering devices to generate the control signal. The control signal can control operation of the at least one controller distributing power to the plurality of sites.

In some embodiments, the computing device can be further configured to determine the number of metering devices to use to generate the control signal based on a variance of total delivered voltage to the plurality of sites and a variance difference threshold. The total delivered voltage can be based on the delivered voltage information for each of the plurality of sites. In some embodiments, the computing device can be further configured to determine the number of metering devices to use to generate the control signal based on a dispersion of the total delivered voltage to the plurality of sites and an individual dispersion of the delivered voltage information for each of the plurality of metering devices. In some embodiments, the computing device can be further configured to identify a total number of metering devices of the plurality of sites, and determine the number of metering devices to use for the subset of metering devices based on a square root of the total number of metering devices.

In some embodiments, the computing device is further configured to determine a first covariance weighted distance for a total delivered voltage to the plurality of sites. The computing device can be further configured to determine a second covariance weighted distance for each of the plurality of sites based on the delivered voltage information from each of the metering devices. The computing device can be further configured to determine the number of metering devices to use for the subset of metering devices based on the first covariance weighted distance, the second covariance weighted distance, and a variance difference threshold. In some embodiments, the variance difference threshold can include an error margin for an estimate of a sample-size dependent variance ratio.

In some embodiments, the computing device can be further configured to determine, for each of the plurality of sites, an expected value of the delivered voltage information. The computing device can be further configured to determine the number of metering devices for the subset of metering devices based on the expected value. In some embodiments, the computing device can be further configured to select the subset of metering devices that have a lowest expected value of the delivered voltage information.

In some embodiments, the computing device can be further configured to determine a median value for each of the plurality of sites based on the delivered voltage information from each of the metering devices. The computing device can be further configured to select one or more metering devices of the plurality of sites that have a lowest median value of the delivered voltage information to form the subset of the metering devices.

In some embodiments, the computing device can be further configured to determine a spatial median value for each of the plurality of sites based on the delivered voltage information from each of the metering devices. The computing device can be further configured to select one or more metering devices of the plurality of sites that have a lowest spatial median value to form the subset of the metering devices. In some embodiments, the computing device can be further configured to transmit the generated control signal to the at least one controller of the plurality of sites.

Yet another aspect of the present disclosure is directed to a voltage optimization system. In some embodiments, the system includes a distribution circuit and a plurality of power controllers. Each of the plurality of power controllers is configured to control a voltage delivered from the distribution circuit to at least one customer site associated with the power controller. The customer site has an associated metering device. Each of the metering devices is configured to measure and report a voltage delivered to the customer site. The system also includes a computing system having a memory and a processor. The processor is configured to receive information from the metering devices relating to the voltages. The processor is further configured to select, using the information relating to the voltages and the power demands, a subset of the metering devices. The processor is further configured to generate, based on the information associated with the subset of the metering devices, at least one control signal to control operation of the plurality of power controllers.

In some embodiments, the subset of metering devices can be selected by determining for each of the customer sites, an expected value of the voltage delivered to the customer site, determining a desired size of the subset of metering devices, and selecting the subset of the metering devices as the S metering devices having the lowest expected values of voltage. In some embodiments, determining the desired size of the subset of metering devices can include calculating, in the computing system, an expected value of a total voltage delivered to the customer sites associated with the metering devices, a variance of the voltages delivered to the customer sites associated with the metering devices, for each of the customer sites, a variance of the voltage delivered to the customer site, and determining the size S to be a positive integer such that:

$$\left| \sum_{p=0}^{S-1} \sigma_{pk} - \frac{S}{M} \sigma_k \right| < \varepsilon,$$

wherein $\sigma^2_{pk}$ is a variance of the voltage at customer site p over an interval k, $\sigma^2_k$ is the variance of the total voltage delivered to the customer sites associated with the metering devices, M is a number representing the total number of customer sites, and $\varepsilon$ is a predetermined constant.

In some embodiments, a the desired size of the subset of metering devices can be determined to be the smallest positive integer that is no less than a square root of M such that:

$$\left| \sum_{p=0}^{S-1} \sigma_{pk} - \frac{S}{M} \sigma_k \right| < \varepsilon.$$

In some embodiments, a subset of the metering devices can be selected by calculating, for each of the customer sites, a median value of the voltage delivered to the customer site, determining a desired size of the subset of metering devices, selecting the subset of the metering devices as the metering devices having the lowest median values of voltage.

In some embodiments, the size of the subset of metering devices can be determined by calculating a median value of the voltages delivered to the customer sites associated with the metering devices, a dispersion of the voltages delivered to the customer sites associated with the metering devices, for each of the customer sites, a dispersion of the voltage delivered to the customer site, and determining the size of the subset S to be a positive integer such that:

$$\left| \sum_{p=0}^{S-1} \sigma_{pk} - \frac{S}{M} \sigma_k \right| < \varepsilon,$$

wherein $\theta_{pk}$ is a dispersion of the voltage at customer site p over an interval k, $\theta_k$ is the dispersion of the total voltage delivered to the customer sites associated with the metering devices, M is a number representing the total number of customer sites, and $\varepsilon$ is a predetermined constant.

In some embodiments, the size of the subset of metering devices can be determined to be the smallest positive integer that is no less than a square root of M such that:

$$\left|\sum_{p=0}^{S-1} \vartheta_{pk} - \frac{S}{M}\vartheta_k\right| < \varepsilon.$$

In some embodiments, selecting a subset of the metering devices includes calculating, in the computing system, for each of the customer sites, a spatial median value of the voltage delivered to the customer site, determining a desired size of the subset of metering devices, and selecting the subset of the metering devices as the S metering devices having the lowest spatial median values of voltage.

In some embodiments, determining the desired size, S, of the subset of metering devices includes calculating, in the computing system, a spatial median value of the voltages delivered to the customer sites associated with the metering devices, a Mahalanobis distance of the voltages delivered to the customer sites associated with the metering devices, for each of the customer sites, a Mahalanobis distance of the voltage delivered to the customer site, and determining S to be a positive integer such that:

$$\left|\sum_{p=0}^{S-1} H_{pk} - \frac{S}{M}H_k\right| < \varepsilon,$$

wherein $H_{pk}$ is a dispersion of the voltage at customer site p over an interval k, $H_k$ is the dispersion of the total voltage delivered to the customer sites associated with the metering devices, M is a number representing the total number of customer sites, and $\varepsilon$ is a predetermined constant.

In some embodiments, determining the desired size, S, of the subset of metering devices includes determining S to be the smallest positive integer that is no less than a square root of M such that:

$$\left|\sum_{p=0}^{S-1} H_{pk} - \frac{S}{M}H_k\right| < \varepsilon.$$

Yet another aspect of the present disclosure is directed to a method of optimizing voltage controlled by a plurality of power controllers. The method includes, in a computing system having a memory and a processor, receiving information from each of a plurality of metering devices relating to voltages delivered to a customer and their power demand or amount of energy the customer site used (e.g., voltage and/or current information, voltage and/or current samples and times associated with the samples). The method also includes selecting, using the delivered voltage information, a subset of the metering devices. The method also includes generating, based on the information associated with the subset of the metering devices, at least one control signal to control operation of a plurality of power controllers. Each of the power controllers in the plurality of power controllers is configured to control a voltage delivered from a distribution circuit to at least one customer site associated with the power controller and having an associated metering device. Each of the metering devices is configured to measure and report the voltage delivered to the customer site and the power demand of the customer site.

Yet another aspect of the present disclosure is directed to a non-transitory computer readable medium encoded with instructions that, when executed on a processing unit, perform a method. The method includes, in a computing system having a memory and a processor, receiving information from each of a plurality of metering devices relating to voltages delivered to the customer and their power demands. The method also includes selecting, using the information relating to the voltages and the power demands, a subset of the metering devices. The method also includes generating, based on the information associated with the subset of the metering devices, at least one control signal to control operation of a plurality of power controllers. Each of the power controllers in the plurality of power controllers is configured to control a voltage delivered from a distribution circuit to at least one customer site associated with the power controller and having an associated metering device. Each of the metering devices is configured to measure and report the voltage delivered to the customer site and the power demand of the customer site.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different figures indicates similar or identical items.

DETAILED DESCRIPTION

Figure 1:
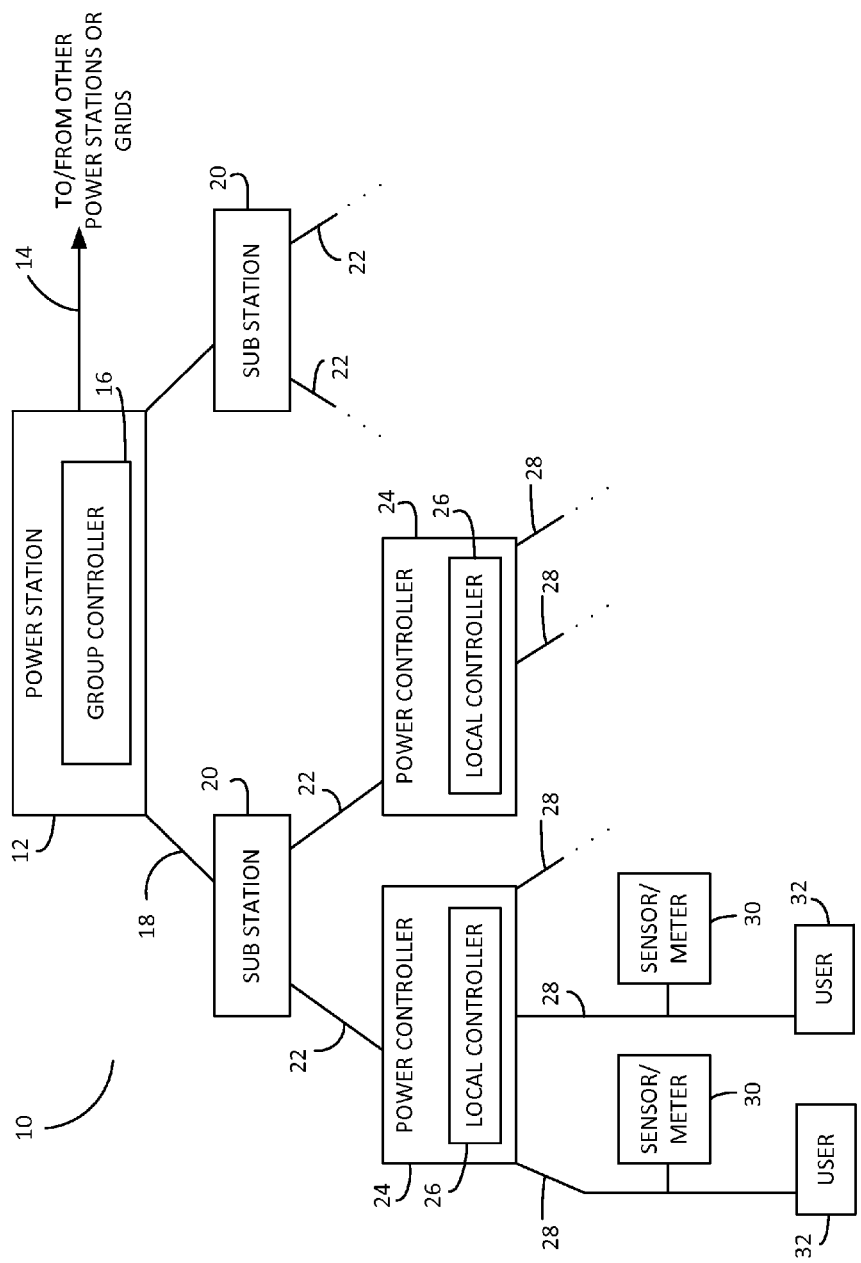
FIG. 1 is an example block diagram of an electrical power distribution system, in accordance with an embodiment.

FIG. 1 is a block diagram of an electrical power distribution system 10, which is an exemplary environment suitable for implementation of the presently-disclosed concepts. The power distribution system 10 includes a power station 12, that may be coupled to a power source or sink via a high voltage bus 14. In one embodiment, the power station 12 includes one or more generators. In one embodiment, the power station 12 distributes power delivered via the bus 14. In one embodiment, the power station 12 delivers power to other power distribution systems via the bus 14. As will be appreciated, the role of the power station 12 may change with time and demand, e.g., it may supply excess power to other systems when local load conditions permit and it may be supplied with power at other times based on local load conditions.

The power station 12 includes one or more group controllers 16. Power is distributed via buses 18 from the power station 12 to one or more substations 20. In turn, each substation 20 delivers power further "downstream" via buses 22. It will be appreciated that a series of voltage transformations are typically involved in transmission and distribution of electrical power via the various power stations 12 and substations 20 and that the system 10 being described exemplifies such systems that may include additional or fewer layers of transformation and distribution.

The substation 20 delivers electrical power via buses 22 to one or more power regulation devices 24, which may include a local controller 26. In turn, the power regulation devices 24 deliver electrical power further downstream via buses 28. Ultimately, electrical power is coupled to a sensor 30 and/or to a user 32. Sensors 30 tend to be associated with critical loads such as hospitals.

In one embodiment, the electrical power is coupled to a sensor 30 capable of determining electrical parameters associated with power consumption and transmitting those assessed parameters to the associated local controller 26 and/or to the group controller 16. It will be appreciated that any medium suitable to data transmission may be employed, such as radio links, which may utilize spread spectrum coding techniques or any suitable modulation of spectrum management methods suitable for data communications, point-to-point radio links, fiber optical links, leased lines, data signals coupled via power lines or buses, telephone links or other infrastructural data communications paths. In some embodiments, such may also be conveniently collateral to power distribution system elements (e.g., coaxial cables employed for data transmission such as are often employed in cable television systems).

In one embodiment, the sensor 30 measures voltage and is also part of an electrical meter used for measuring the amount of electrical power used and thus for determining billing data, such as a conventional Automatic Meter Reader or AMR. In one embodiment, the sensor 30 is equipped to assess line voltage delivered to the user 32, or "delivered voltage". In one embodiment, the sensor 30 is equipped to measure current.

In one embodiment, the local controller is configured to respond to several associated sensors. This may be accomplished by dynamically determining which one or ones of an associated plurality of sensors is providing data most relevant to determining how to most effectively adjust the associated output electrical parameter. Effective control of power delivered by the associated power regulation device 24 is determined by selecting between the associated sensors, dependent upon changes in current draw in different loads controlled by the power regulation device 24, load shifts or voltage changes. In one embodiment, the selection tends to be responsive to the sensor that results in optimal power conservation.

In one embodiment, the sensor 30 is equipped to assess one or more of power factor or VAR (or Volt Amperes Reactive). Power factor is the ratio of real power to apparent power, where real power is the real component of the complex power, while apparent power is the magnitude of the complex power. For example, the power factor can be determined using the following equation: Power$_{13}$ Factor=P/|S|, where the real power P is the real component of the complex power and the apparent power |S| is the magnitude of the complex power as follows: S=P+jQ (where j is the imaginary root in complex numbers or the solution of the equation $j^2=-1$).

The complex component of the complex power, on the other hand, is the reactive power, expressed as VAR, that results from the phase displacement between the voltage and current caused by inductive or capacitive loads. Power factor can be significant because transmission losses known as $I^2R$ losses can increase when the currents associated with driving the load increase without necessarily delivering more total work to the load.

These losses can result in situations where the total power demanded from the power station 10 or substation 20 actually decreases when line voltage to the user 32 increases. One example of such a situation is where the load is highly inductive and the amount of work accomplished is controlled primarily by the amount of current drawn by the load, e.g., loads including electrical motors.

In the presently-disclosed system, such a controller advantageously also effectuates data collection and logging. In one embodiment, at least the group controller 16 records a conventional system data log for tracking voltage, current, kilowatt demand and power factor or kilo volt-amp reactive power and the like over time. In one embodiment, at least the group controller 16 records a conventional event log for tracking load tap control data, voltage regulation data and breaker operations and the like over time. In one embodiment, at least the group controller 16 records a conventional status log for tracking position of load tap controls, voltage regulator setting, breaker settings and the like over time.

In one embodiment, at least the group controller 16 records minimum and maximum values for conventional electrical parameters such as voltage, kilowatt demand, KVAR demand, and the like versus time. In one embodiment, such conventional data are collected at regular intervals, such as every thirty seconds or every minute. In one embodiment, additional such conventional data logs are recorded by local controllers 26 as well.

Figure 2:
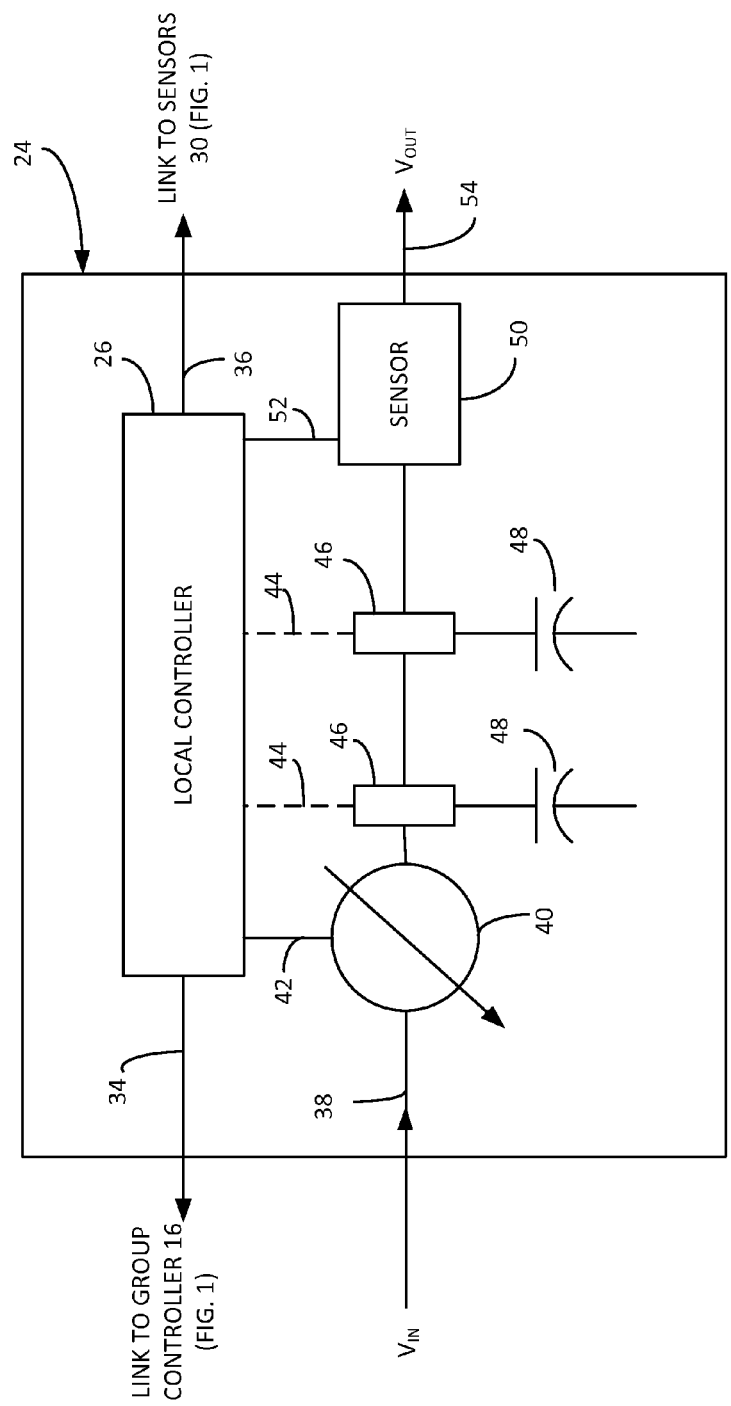
FIG. 2 is an example block diagram of a power controller, in accordance with an embodiment.

FIG. 2 is a block diagram of a power controller 24 for use in the system 10 of FIG. 1. The power controller 24 includes the local controller 26 of FIG. 1. The local controller 26 is linked to the group controller 16 via a data path 34 and is linked to the downstream sensors 30 of FIG. 1 via a data path 36. The power controller 24 accepts input electrical energy $V_{IN}$ via a bus 38 that is coupled to a voltage regulator 40. In one embodiment, the voltage regulator 40 comprises a conventional autotransformer employing a make-before-break variable tap that is set in conformance with command signals communicated from the local controller 16 via a data path 42.

The power controller 24 also optionally includes a data path 44 coupled to switches 46. The switches 46 couple elements 48 for power factor management into or out of the circuit in response to commands from the local controller 26. In one embodiment, the elements 48 comprise conventional capacitors that are switched into or out of the circuit in conformance with commands from the local controller 26.

A sensor 50 is coupled to the local controller 26 via a data path 52. The sensor 50 measures electrical parameters associated with electrical energy leaving the power controller 24, such as kiloWatt hours, current, voltage and/or power factor. The power controller 24 delivers electrical energy $V_{OUT}$ for downstream distribution via a bus 54.

In one embodiment, the local controller 26 regulates power delivery subject to overriding commands from the group controller 16. In one embodiment, the power controller 24 increments (or decrements) line voltage at the 120/240 volt distribution level. In one embodiment, the power controller 24 changes output voltage in increments of ⅝%, or about 0.75 volt steps at the 120 volt level. In one embodiment, when larger changes in voltage are desirable, the power controller 24 allows a stabilization interval of between forty seconds and two minutes between an increment and evaluation of system parameters prior to making a next incremental voltage change. A fuller discussion of methods for maintaining voltage stability can be found in U.S. Patent Application Publication No. 2010/0090674, issued as U.S. Pat. No. 8,670,876 entitled "Electric Power Control System and Process," the disclosure of which is hereby incorporated by reference herein in its entirety. For example, the method can include continuously detecting measurements of electrical power supplied to one or more electrical devices from a power source. Estimated deviant voltage levels that the supplied electricity will not drop below or exceed as a result of varying electrical consumption by the one or more electrical devices can be continuously computed. The deviant voltage levels may be computed based on a predetermined confidence level and specific properties of the effects on measured voltage due to varying consumption computed from the detected measurements. A voltage level output of the electricity supplied to the electrical device may be adjusted based on the computed deviant voltage level. In some embodiments, the deviant voltage levels may be based on measurements obtained from each of the three phases in a three-phase electric power distribution system. A voltage level supplied to the three-phase distribution system may be adjusted by a voltage regulator capable of setting three-phase voltages, thus maintaining voltage stability.

In one embodiment, the power controller 24 maintains delivered line voltage in band of voltages ranging from about 110 volts or 114 volts to about 126 volts to 129 volts, with 117 volts being exemplary, and with a reduced level of about 110 to 100 volts being applicable in emergency or brownout situations.

In silicon refining plants, power control can be crucial to maintaining the melt at the appropriate temperature and also for maintaining an appropriate rotation speed in Czochralski crystal growth apparatus. As a result, the criticality of power regulation depends on the end use to which the user puts the power. Programming parameters used in the local controller 26 of the power controllers 24 can be set in light of these needs to effect the desired power regulation.

In some power distribution situations, power control is important because the contractual arrangements between the user and the service provider result in increased power rates for a period, such as a year, if a maximum or peak amount of power contracted for is exceeded even once. Accordingly, such users have incentives to regulate power use to obviate exceeding that contractual amount.

Figure 3:
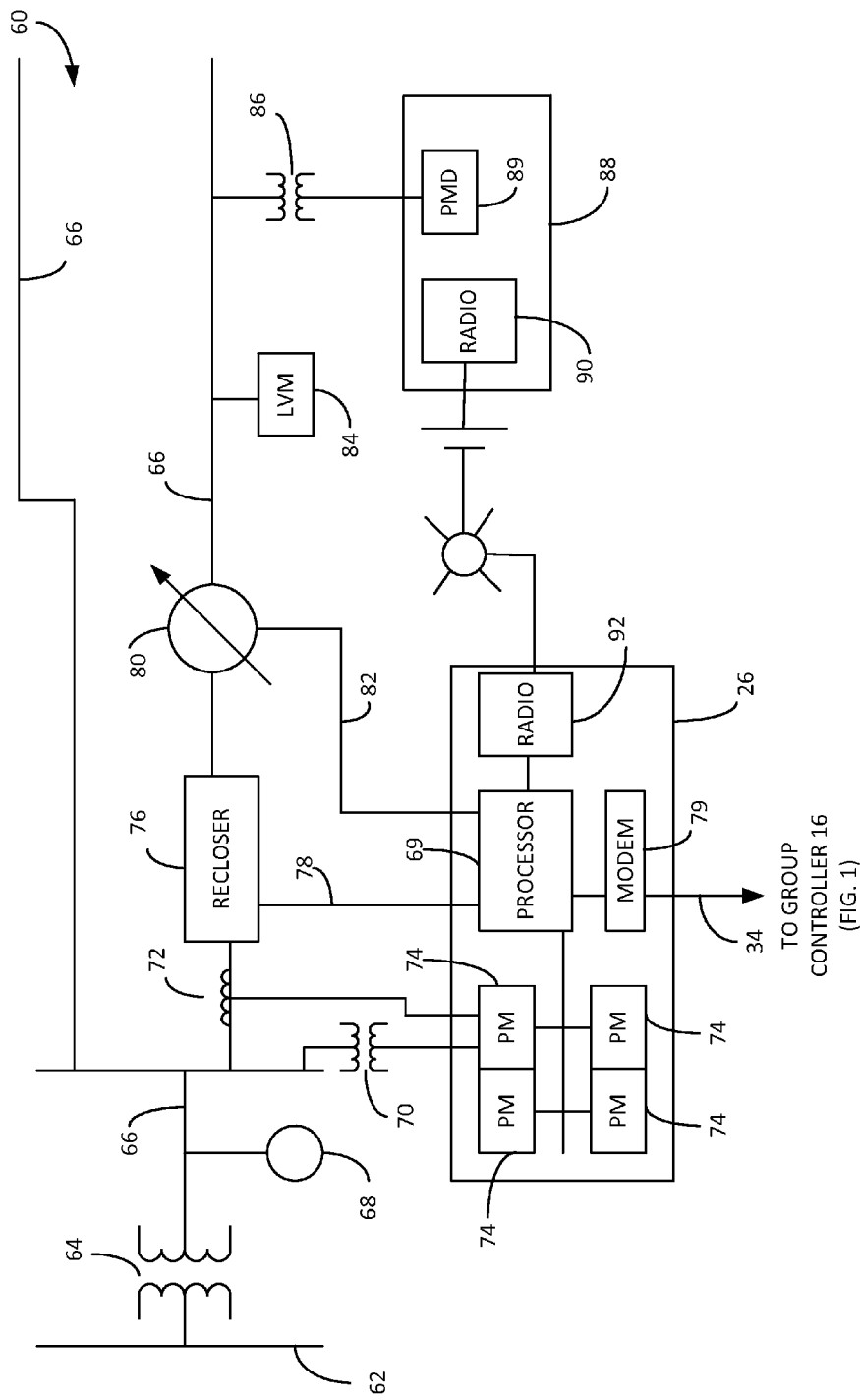
FIG. 3 is an example block diagram of an exemplary system illustrating application of a power controller, in accordance with an embodiment.

FIG. 3 is a block diagram of an exemplary system 60 illustrating application of the power controller 24 of FIG. 2. In the exemplary system 60, electrical power is distributed at a first voltage, such as 115 kilovolts, over bus 62. The electrical power is stepped down to a reduced voltage, such as 12.5 kilovolts, by a transformer 64, and is transmitted downstream via a bus 66. A billing meter 68 may be coupled to the bus 66. The local controller 26 includes one or more processors 69.

Taps 70 and 72 are coupled to a power monitor PM 74 in the local controller 26 to allow the processor 69 to monitor electrical parameters associated with the power controller 24. In one embodiment, the power monitor PM 74 monitors voltage. In one embodiment, the power monitor PM 74 monitors power factor. In one embodiment, the power monitor PM 74 monitors electrical power. In one embodiment, the power monitor PM 74 monitors current. A conventional recloser or circuit breaker 76 is coupled in series with the bus 66 and is coupled to the processor 69 in the local controller 26 via a data path 78, allowing monitoring and/or control of the recloser 76.

The processor 69 in the local controller 26 is coupled to the group controller 16 (FIG. 1) via data path 34. In this example, a conventional modem 79 is employed for bidirectional data transfer.

A voltage regulator 80 is coupled in series in the bus 66. The voltage regulator 80 is responsive to control signals delivered from the processor 69 in the local controller 26 via a data path 82, and the local controller 26 also is able to collect status data from the voltage regulator 80 via this data path.

Electrical power is then transferred downstream via the bus 66, which may include line voltage monitors LVM 84 disposed at strategic intervals and in data communication with the local controller 26. In one embodiment, a step-down transformer, instrument transformer, potential transformer or transducer 86 located near the point of use transforms the intermediate voltage employed on the bus 66 to voltages suitable for sensing equipment such as a sensing module 88. The device 86 is calibrated to permit readings corresponding to user voltages but is not necessarily as precise as transformers used to transform intermediate transmission voltage levels to end use voltage levels or in conjunction with power metering purposes.

The module 88 for measuring electrical parameters associated with delivered power and/or voltage is typically located at or near the transformer or device 86, between or near the transformer or device 86 and the end user 32 (FIG. 1), and may include power measurement devices PMD 89 for billing purposes. The module 88 is in data communication with the local controller 26 via a data path, in this example, via a radio 90 that exchanges radio signals with a radio 92 that is coupled to the processor 69 in the local controller 26.

Data communications via the various links may be effected using any known or conventional data transfer protocol and method, e.g., may be signals transmitted using American Standard Code for Information Interchange (ASCII) via an RS-232 or EIA 485 serial data signalling standard, for example with the data transfer transactions managed by the DNP3 utility data communications protocol.

Voltage Optimization Systems

According to certain embodiments, a utility voltage optimization system is configured to uniformly provide AC voltage at all times to all utility delivery points that maximizes the efficiency of the customers' consumption devices, subject to the broad constraints previously outlined. In principle, any one of the delivery point voltage observations may, at any time, influence the actions decided by the voltage optimization system, consistent with its operational objective. The voltage optimization system may be resident at power station 12, for example, in group controller 16.

Having a very large plurality of observation sites may, in some optimization systems, impose unreasonable computational burdens on the realization of operational decisions. In certain embodiments, a voltage optimization system may perform a procedure that permits selection of a subset of observation sites that can be shown to realize the same operational decisions in the voltage optimization system.

As there are statutory limits on the AC voltage delivered to utility customers, voltage observation may be especially informative in the regions near these limits. However, these subsets also may be suitably representative of the utility customer power demand process more generally, such that the actions decided by the optimization system are not improperly influenced by some process not representative of the power demand behavior of the customers affected by such actions. The selection of such subsets may be carried out using sampling rules dependent on the availability of information at each measurement site.

Operation of a voltage optimization system in accordance with the principles described above will now be discussed. In this discussion, the following symbols and quantities may be employed:

Definitions
  M total available metering sites
  m metering site index, $0 \leq m < M$
  $\Delta t$ base sample interval for all electrical quantities reported by meters
  T natural period of the demand process of interest
  K number of analysis periods
  k analysis period index, $0 \leq k < K$
  N number of base samples in each analysis period
  n relative sample index within an analysis period, $0 \leq n < N$
  $v_{mkn}$ sample of a quantity of interest, as observed at metering site m for sample interval $n\Delta t$ within analysis period k
  $\mu$ statistical location of the quantity of interest as used in this analysis (note that in statistics, a location family is a class of probability distributions that is parametrized by a scalar- or vector-valued parameter that determines the "location" or shift of the distribution; common measures of location, or central tendency, are the arithmetic mean, median, mode, and interquartile mean), scope defined by the use of subscripts
  $\sigma,\rho$ statistical scale of the quantity of interest as used in this analysis, scope defined by the use of subscripts
  $\epsilon$ acceptable absolute error between subpopulation (e.g., subset of plurality of metering devices) variances and proportional full population (e.g., plurality of metering devices) variance (e.g., variance error threshold)

Derived Quantities $$\mu_{mk} = E\{v_{mkn}\}$$

expectation of quantity v at metering site m for analysis interval k, computed using samples $0 \leq n < N$ $$\sigma_{mk}^2 = E\{[(v)]_{mkn} - \mu_{mk})^2\}$$

variance of quantity v at metering site m for analysis interval k, computed using samples $0 \leq n < N$ $$\varphi_{mk} = \mathrm{Med}\{v_{mkn}\}$$

median of quantity v at metering site m for analysis interval k, computed using samples $0 \leq n < N$ $$\vartheta_{mk} = e^{\frac{1}{N}\sum_n \ln|v_{mkn} - \varphi_{mk}|}$$

dispersion of quantity v at metering site m for analysis interval k, computed using samples $0 \leq n < N$ $$\hat{\varphi}_{mk} = \underset{\varphi}{\operatorname{argmin}} \sum_{n=0}^{N-1} \|v_{mkn} - \varphi\|$$

spatial (aka L1) median of quantity v at metering site m for analysis interval k, computed using samples $0 \leq n < N$ $$h_{mk} = \sqrt{(v_{\mathrm{mkn}} - \mu_{mk})^T \Psi^{-1} (v_{\mathrm{mkn}} - \mu_{mk})}$$

covariance weighted distance of quantity v at metering site m for analysis interval k, computed using samples $0 \leq n < N$, also known as the Mahalanobis distance, where $\Psi$ is the covariance of the observations $v_{mkn}$ $$H_{mk} = \sqrt{(v_{\mathrm{mkn}} - \varphi_{mk})^T \Psi^{-1} (v_{\mathrm{mkn}} - \varphi_{mk})}$$

covariance weighted distance of quantity v at metering site m for analysis interval k, computed using samples $0 \leq n < N$, a modification of the Mahalanobis distance, where $\Psi$ is the covariance of the observations $v_{mkn}$ A process for optimizing voltage controlled by a plurality of power controllers is now described with reference to FIGS. 4-6. In the presently described process, it is assumed (1) that the observations generated by the demand processes at the metering sites are independent and (2) that the probability densities of the observations of the quantity of interest may be satisfactorily approximated by the Gaussian density.

The process begins at block 401, where the voltage optimization system receives voltage and demand information from metering devices. For example, a computing device can receive delivered voltage information that includes a voltage measurement and a sample time associated with the measurement from each metering device of each of the sites, where the metering devices meter power distributed to the sites. As shown in FIG. 1, metering devices 30 may be in communication with power controllers 24, which in turn may be in communication with sub stations 20 and ultimately with power station 12. In the presently described embodiment, the voltage optimization system operates at the level of power station 12, and thus relates to all meters 30 in the network. In other embodiments, for example, one or more voltage optimization systems may operate at the level of sub stations 20, or even at the level of power controllers 24.

The process continues at block 402, where the voltage optimization system (or a computing device) selects a subset of the metering devices using the voltage and demand information that was received at block 401. A size of the subset (e.g., the number of metering devices to select to form the subset) can be determined based on delivered voltage information (e.g., a voltage measurement and a sample time associated with the measurement). The system may select the determined number of metering devices or at least the determined number of metering devices (e.g., the determined number plus a predetermined number or variable). The selected metering devices correspond to customer sites. Further details of block 402 are shown in FIG. 5. As shown in a sub-process in FIG. 5, at block 501, the voltage optimization system calculates an expected value of the voltage delivered to each customer site, namely, quantities $\mu_{mk} = E\{v_{mkn}\}$, as was described above. In some embodiments, the voltage optimization system may sort the metering sites in ascending order according to this value at this point.

The sub-process continues at block 502, where the voltage optimization system determines a desired size of the subset of the metering devices. For example, the size of the subset may refer to a number of metering devices to use to generate a control signal to control operation of the at least one controller distributing power to the plurality of sites. This number or size can be determined based on the delivered voltage information for each of the plurality of sites. As was described previously, the calculations performed to determine how to control the voltage produced and distributed throughout the network may be simplified by selecting a subset of the available metering devices to be used as representative of all metering devices. Further details of block 502 are shown in FIG. 6. As shown in a sub-process in FIG. 6, at block 601, the voltage optimization system calculates an expected value of the total voltage delivered to all customer sites, namely, quantity $\mu_k$.

In some embodiments, the sub-process continues at block 602, where the voltage optimization system calculates an overall variance of voltages delivered to the customer sites, namely, quantity $\sigma_k^2$. The sub-process continues at block 603, where the voltage optimization system calculates the variances of the individual voltages delivered to the different customer sites, namely, quantities $\sigma_{mk}^2$. The sub-process continues at block 604, where the voltage optimization system determines a value of S, e.g., the desired size of the subset of metering sites to be selected. For example, the computing device can determine the number of metering devices, S, to use to generate the control signal based on a variance of total delivered voltage to the plurality of sites and a variance difference threshold (e.g., an error margin for an estimate of a sample-size dependent variance ratio). The value S can be determined to be a positive integer such that:

$$\left| \sum_{p=0}^{S-1} \sigma_{pk} - \frac{S}{M}\sigma_k \right| < \varepsilon.$$

Calculation of the value S satisfying the inequality above may be performed by assuming an initial putative value of S (e.g., a minimum value such as the square root of M), and evaluating the inequality above. If the inequality is not satisfied, an iterative process may be performed, in which S is incremented upward and the inequality is evaluated again. This iterative process may be limited by an iteration limit (e.g., a predetermined number, the square root of M, a predetermined number based on the square root of M, etc.), to prevent the calculation of a number of iterations that is too high to be useful.

Figure 5:
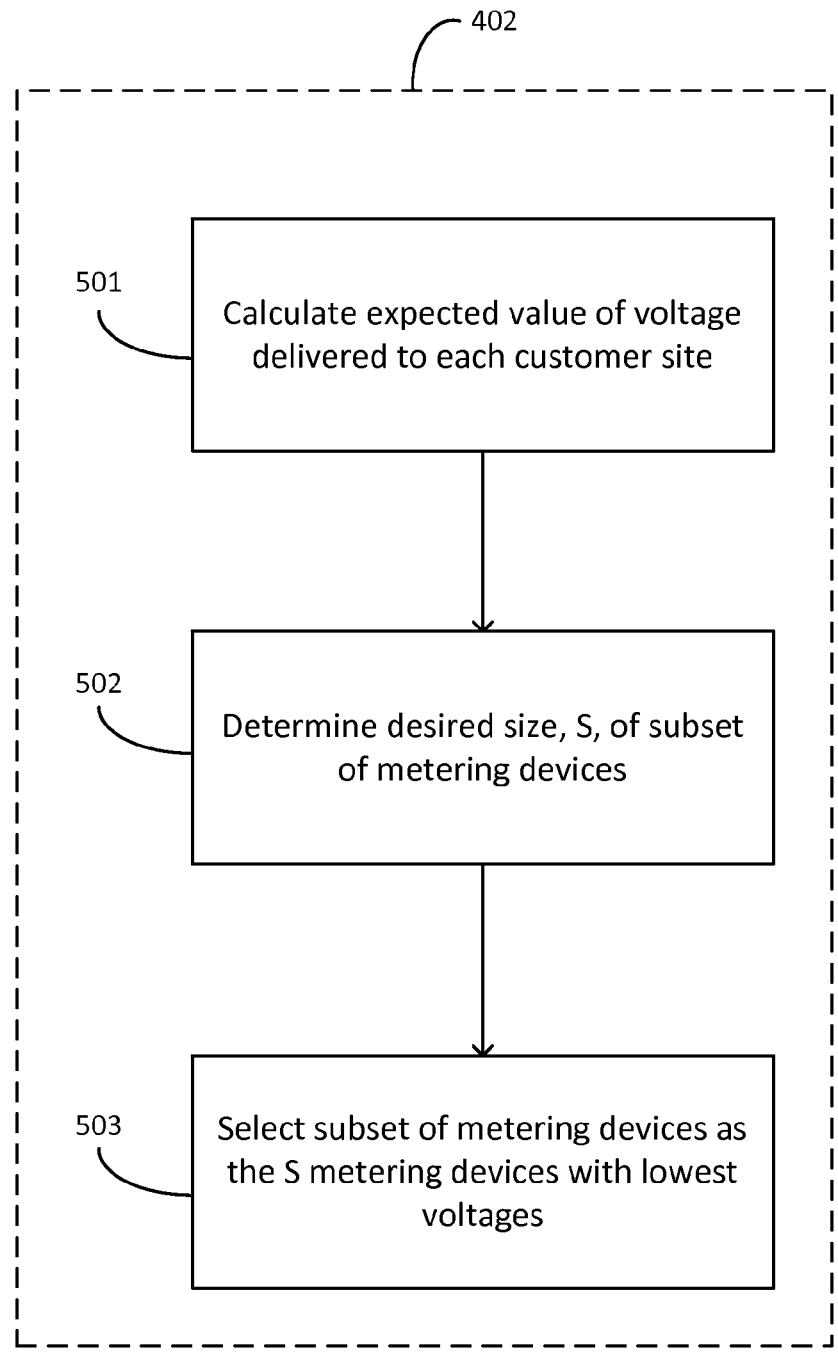
FIG. 5 is an example flow chart of a process for optimizing voltage, in accordance with an embodiment.
Figure 6:
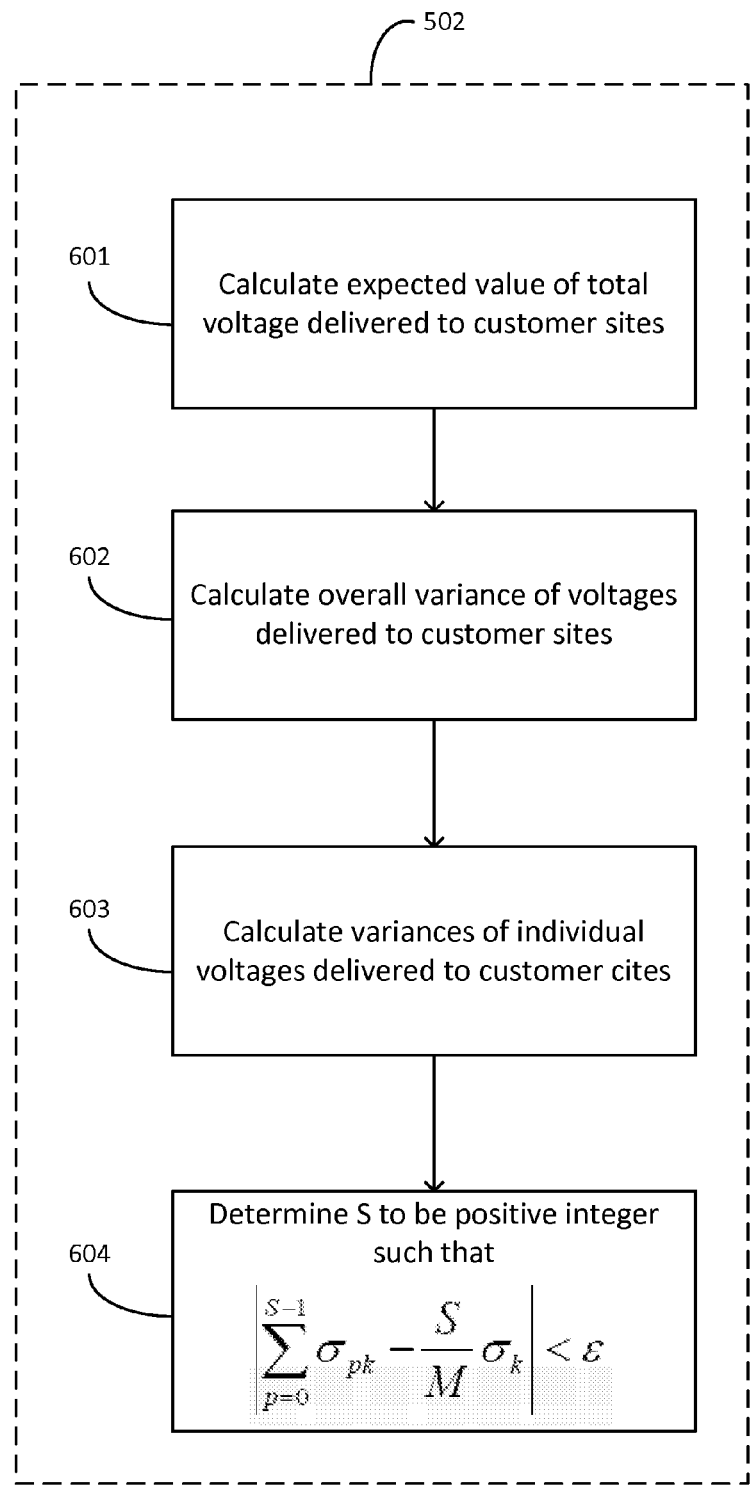
FIG. 6 is an example flow chart of a process for optimizing voltage, in accordance with an embodiment.

Having determined a value of S, the sub-process of FIG. 6 returns to the sub-process of FIG. 5, which continues at block 503, where the voltage optimization system selects a subset of the metering devices as being the S metering devices which caused the inequality above to be satisfied. If the voltage optimization system has sorted the metering devices as described above, the set of metering devices to be analyzed will now simply be the first S metering devices in the sorted list, which have the lowest associated voltages by virtue of the pre-sorting. In other embodiments, a different set of S metering devices also may be selected that is not necessarily strictly the ones having the smallest values. For example, the metering devices may not be pre-sorted, or may be sorted according to another metric such as median, spatial median, etc.

Figure 4:
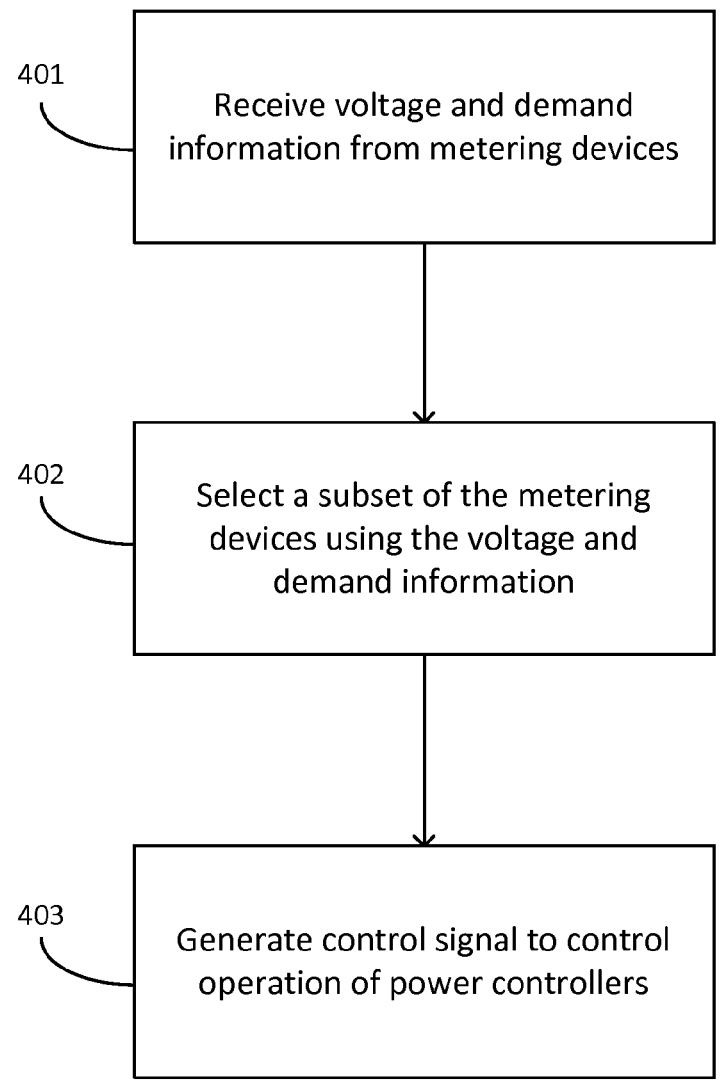
FIG. 4 is an example flow chart of a process for optimizing voltage, in accordance with an embodiment.

Having selected a subset of the metering devices, the sub-process of FIG. 5 returns to the process of FIG. 4, which continues at block 403, where the voltage optimization system generates a control signal to control operation of the power controllers in the network. This may be performed, e.g., by applying an appropriate voltage management algorithm to determine the appropriate actions to be performed by the power controllers. For example, a computing device can use the delivered voltage information (e.g., a voltage measurement and a sample time associated with the measurement) of the subset of metering devices to generate the control signal to control operation of the at least one controller distributing power to the plurality of sites. Voltage management algorithms may include, e.g., Volt-VAR optimization algorithms that manage voltage levels and reactive power in an electricity distribution system by adjusting tap positions or capacitor switching to control voltage levels, Conservation Voltage Reduction that flattens and then lowers overall system voltage while satisfying ANSI standards, targeting power factor levels, etc. The computing device can transmit the generated control signal to at least one controller that controls voltage delivers to the sites, store the control information in a database or memory, or otherwise convey the control signal information to facilitate the providing voltage via an electricity distribution system.

One embodiment employing the process described above is further illustrated below in pseudocode. Pseudocode block 1 describes the calculation of certain quantities relating to the metering sites and the higher-level calculations performed in selecting and using a subset of the metering sites. Pseudocode block 2 describes further details of how the subset of the metering sites is determined according to this embodiment.

<Begin pseudocode block 1>
For each analysis interval k , $0 \le k < K$
{
  Estimate mean $\mu_k$ and variance $\sigma_k^2$ for the entire population of metering sites
  For each metering site m , $0 \le m < M$
  {
    Estimate mean $\mu_{mk}$ and variance $\sigma_{mk}^2$
  }
  Sort the M metering site by ascending $\mu_{mk}$ , assigning sort index p such that
    $\mu_{0k} < \mu_{1k} < \ldots < \mu_{pk} < \ldots < \mu_{(M-1)k}$ , $0 \le p < M$
  Choose a subset of observations of size $S < M$ such that $$\left| \sum_{p=0}^{S-1} \sigma_{pk} - \frac{S}{M}\sigma_k \right| < \varepsilon \text{ (see pseudocode block 2)}$$

Apply the subset thus selected in an appropriate voltage management algorithm
}
<End pseudocode block 1>

<Begin pseudocode block 2>
Algorithm for observation subset selection, appropriate for $M > 100$
Set initial nearest integer $S = \sqrt{M}$.
Set iteration limit $I = 0$.

Set initial variance error as $\varepsilon_S = \left| \sum_{p=0}^{S-1} \sigma_{pk} - \frac{S}{M}\sigma_k \right|$.

While $\{\varepsilon_S \ge \epsilon \text{ and } I \le \sqrt{M}\}$
{
  $I = I + 1$
  $S = S + 1$ Compute $\varepsilon_S = \left| \sum_{p=0}^{S-1} \sigma_{pk} - \frac{S}{M}\sigma_k \right|$
}

Compute $\mu_S = \frac{1}{S}\sum_{p=0}^{S-1} \mu_{pk}$

<End pseudocode block 2>

While <pseudocode block 2> provides one example of an iteration limit (e.g., $\{\varepsilon_S \ge \epsilon \text{ and } I \le \sqrt{M}\}$), various embodiments can use different iteration limits or iteration techniques. For example, the iteration limit can be set to half of M, two-thirds of M, a fraction times the square root of M, the square root of M plus a predetermined number or variable, or range from a minimum iteration limit to a maximum iteration limit. In other embodiments, the iteration limit may be determined based on a statistical formula or satisfying a condition.

A process for optimizing voltage controlled by a plurality of power controllers is now described with reference to FIGS. 4, 7 and 8. In the presently described process, it is assumed (1) that the observations generated by the demand processes at the metering sites are independent and (2) that the probability densities of the observations of the quantity of interest may NOT be satisfactorily approximated by the Gaussian density.

The process begins at block 401, and proceeds to block 402, as described above. In the presently described embodiment, however, block 402 comprises a different sub-process, which is shown in FIG. 7. As shown in a sub-process in FIG. 7, at block 701, the voltage optimization system calculates a median value of the voltage delivered to each customer site, namely, quantities $\phi_{mk}=\text{Med}\{v_{mkn}\}$, as was described above. In some embodiments, the voltage optimization system may sort the metering sites in ascending order according to this value at this point.

The sub-process continues at block 702, where the voltage optimization system determines a desired size of the subset of the metering devices. As was described previously, the calculations performed to determine how to control the voltage produced and distributed throughout the network may be simplified by selecting a subset of the available metering devices to be used as representative of all metering devices. Further details of block 702 are shown in FIG. 8. As shown in a sub-process in FIG. 8, at block 801, the voltage optimization system calculates a median value of the total voltage delivered to all customer sites, namely, quantity $\phi_k$.

In some embodiments, the sub-process continues at block 802, where the voltage optimization system calculates an overall dispersion of voltages delivered to the customer sites, namely, quantity $\theta_k^2$. For example, the computing device can determine the number of metering devices to use to generate the control signal based on a dispersion of the total delivered voltage to the plurality of sites and an individual dispersion of the delivered voltage information for each of the plurality of metering devices.

The sub-process continues at block 803, where the voltage optimization system calculates the dispersions of the individual voltages delivered to the different customer sites, namely, quantities $\theta_{mk}^2$. The sub-process continues at block 804, where the voltage optimization system determines a value of S, e.g., the desired size of the subset of metering sites to be selected. The value S is determined to be a positive integer such that:

$$\left| \sum_{p=0}^{S-1} \vartheta_{pk} - \frac{S}{M}\vartheta_k \right| < \varepsilon.$$

Calculation of the value S satisfying the inequality above may be performed by assuming an initial putative value of S (e.g., a minimum value such as the square root of M), and evaluating the inequality above. If the inequality is not satisfied, an iterative process may be performed, in which S is incremented upward and the inequality is evaluated again. This iterative process may be limited by an iteration limit (e.g., the square root of M), to prevent the calculation of a number of iterations that is too high to be useful. The iterative process may be limited using other techniques, such as upon satisfying a condition, or by using other iteration limits, such as square root of M plus or minus a predetermined number or variable, square root of M times a fraction, etc.

Figure 7:
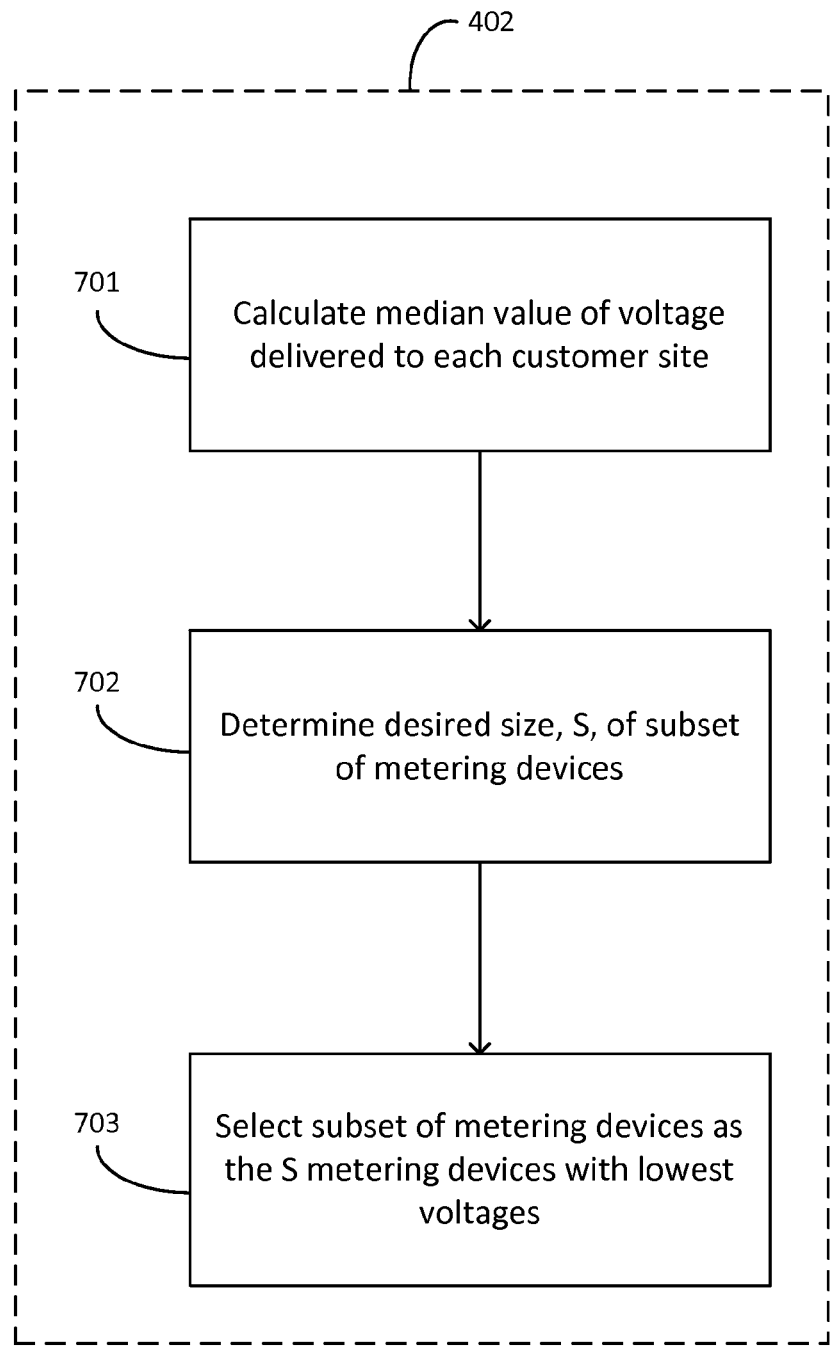
FIG. 7 is an example flow chart of a process for optimizing voltage, in accordance with an embodiment.
Figure 8:
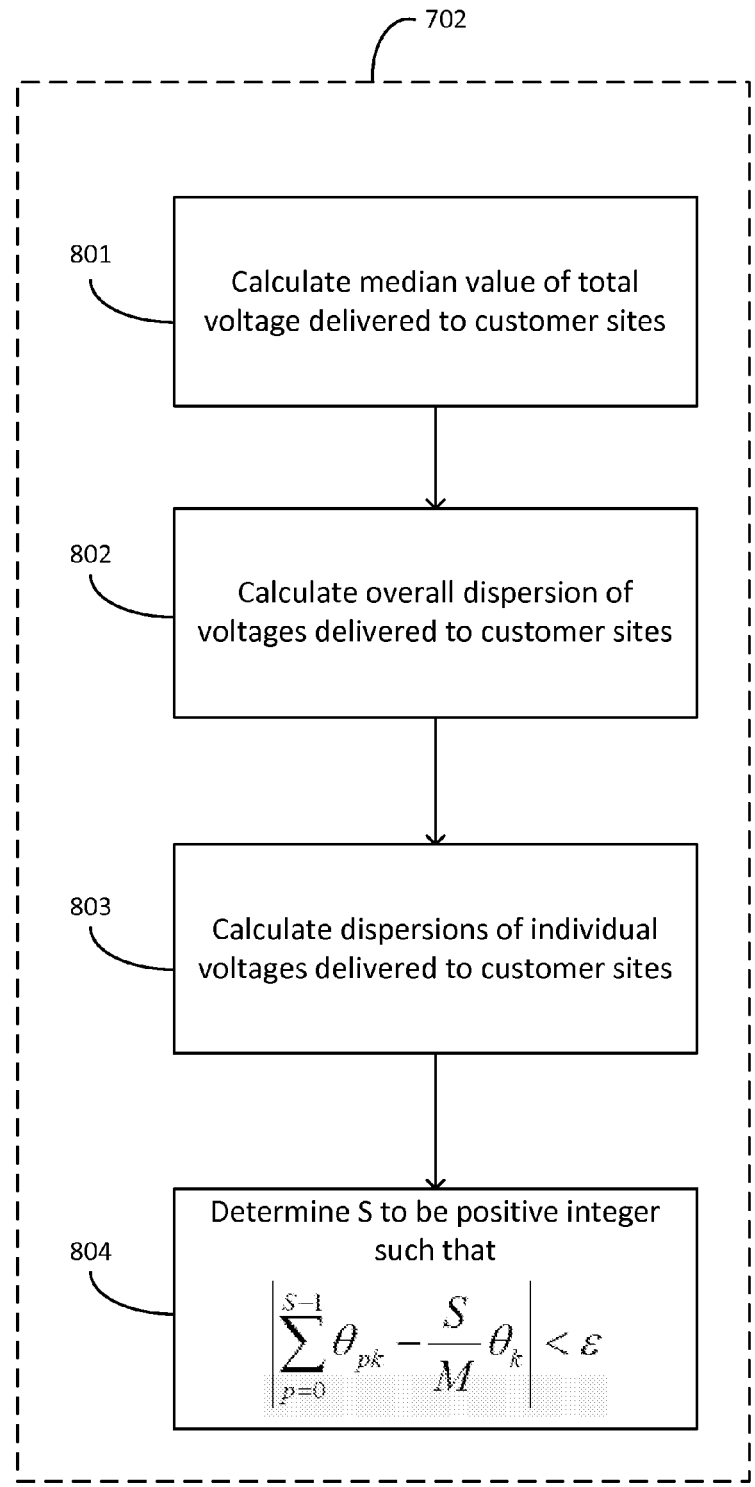
FIG. 8 is an example flow chart of a process for optimizing voltage, in accordance with an embodiment.

Having determined a value of S, the sub-process of FIG. 8 returns to the sub-process of FIG. 7, which continues at block 703, where the voltage optimization system selects a subset of the metering devices as being the S metering devices which caused the inequality above to be satisfied. If the voltage optimization system has sorted the metering devices as described above, the set of metering devices to be analyzed will now simply be the first S metering devices in the sorted list, which have the lowest associated voltages by virtue of the pre-sorting. In other embodiments, a different set of S metering devices also may be selected that is not necessarily strictly the ones having the smallest values. For example, the metering devices may not be pre-sorted, or may be sorted according to another metric such as mean, expected value, spatial median, etc.

Having selected a subset of the metering devices, the sub-process of FIG. 7 returns to the process of FIG. 4, which continues at block 403, where the voltage optimization system generates a control signal to control operation of the power controllers in the network. This may be performed, e.g., by applying an appropriate voltage management algorithm to determine the appropriate actions to be performed by the power controllers.

One embodiment employing the process described above is further illustrated below in pseudocode. Pseudocode block 3 describes the calculation of certain quantities relating to the metering sites and the higher-level calculations performed in selecting and using a subset of the metering sites. Pseudocode block 4 describes further details of how the subset of the metering sites is determined according to this embodiment.

---

<Begin pseudocode block 3>
For each analysis interval k , 0 ≤ k < K
{
    Estimate median $\phi_k$ and dispersion $\theta_k^2$ for the entire population of metering sites
    For each metering site m , 0 ≤ m < M
    {
        Estimate median $\phi_{mk}$ and dispersion $\theta_{mk}^2$
    }
    Sort the M metering sites by ascending $\phi_{mk}$, assigning sort index p such that
        $\phi_{0k} < \phi_{1k} < \ldots < \phi_{pk} < \ldots < \phi_{(M-1)k}$, $0 \le p < M$
    Choose a subset of observations of size S < M such that $$\left| \sum_{p=0}^{S-1} \vartheta_{pk} - \frac{S}{M}\vartheta_k \right| < \varepsilon$$

Apply the subset thus selected in an appropriate voltage management algorithm
}
<End pseudocode block 3>

---

<Begin pseudocode block 4>
Algorithm for observation subset selection, appropriate for M > 100
Set initial nearest integer S = $\sqrt{M}$.
Set iteration limit I = 0.

Set initial variance error as $\varepsilon_S = \left| \sum_{p=0}^{S-1} \vartheta_{pk} - \frac{S}{M}\vartheta_k \right|$.

While {$\varepsilon_S \ge \varepsilon$ and I ≤ $\sqrt{M}$}
{
    I = I + 1
    S = S + 1

Compute $\varepsilon_S = \left| \sum_{p=0}^{S-1} \vartheta_{pk} - \frac{S}{M}\vartheta_k \right|$

}

Compute $\phi_S = \frac{1}{S} \sum_{p=0}^{S-1} \phi_{pk}$

<End pseudocode block 4>

---

While <pseudocode block 4> provides one example of an iteration limit (e.g., {$\varepsilon_S \ge \varepsilon$ and I≤$\sqrt{M}$}), various embodiments can use different iteration limits or iteration techniques. For example, the iteration limit can be set to half of M, two-thirds of M, a fraction times the square root of M, the square root of M plus a predetermined number or variable, or range from a minimum iteration limit to a maximum iteration limit. In other embodiments, the iteration limit may be determined based on a statistical formula or satisfying a condition.

A process for optimizing voltage controlled by a plurality of power controllers is now described with reference to FIGS. 4, 9 and 10.

The process begins at block 401, and proceeds to block 402, as described above. In the presently described embodiment, however, block 402 comprises a different sub-process, which is shown in FIG. 9. As shown in a sub-process in FIG. 9, at block 901, the voltage optimization system calculates a spatial median value of the voltage delivered to each customer site, namely, quantities $$\hat{\varphi}_{mk} = \underset{\varphi}{\operatorname{argmin}} \sum_{n=0}^{N-1} \|v_{mkn} - \varphi\|,$$

as was described above. In some embodiments, the voltage optimization system may sort the metering sites in ascending order according to this value at this point.

In some embodiments, the sub-process continues at block 902, where the voltage optimization system determines a desired size of the subset of the metering devices. As was described previously, the calculations performed to determine how to control the voltage produced and distributed throughout the network may be simplified by selecting a subset of the available metering devices to be used as representative of all metering devices. Further details of block 902 are shown in FIG. 10. As shown in a sub-process in FIG. 10, at block 1001, the voltage optimization system calculates a spatial median value of the total voltage delivered to all customer sites. In some embodiments, the computing device can select one or more metering devices that have a lowest spatial median value to form the subset of the metering devices. For example, the metering devices can be ranked based on spatial median value and a number (e.g., size S) of median devices can be selected that have the lowest spatial median values.

In some embodiments, the sub-process can continue at block 1002, where the voltage optimization system calculates an overall Mahalanobis distance of voltages delivered to the customer sites, namely, quantity $h_k$, or in other embodiments, $H_k$. For example, the computing device can determine a first covariance weighted distance for a total delivered voltage to the customer sites.

The sub-process can continue at block 1003, where the voltage optimization system calculates the Mahalanobis distances of the individual voltages delivered to the different customer sites. For example, the computing device can determine a second covariance weighted distance for each of the sites based on the delivered voltage information from each of the metering devices.

The sub-process can continues at block 1004, where the voltage optimization system determines a value of S, e.g., the desired size of the subset of metering sites to be selected. For example, the computing device can determine a number, S, of metering devices to use for the subset of metering devices based on the first covariance weighted distance, the second covariance weighted distance, and a variance difference threshold. For example, the value S can be determined to be a positive integer such that:

$$\left| \sum_{p=0}^{S-1} H_{pk} - \frac{S}{M} H_k \right| < \varepsilon.$$

Calculation of the value S satisfying the inequality above may be performed by assuming an initial putative value of S (e.g., a minimum value such as the square root of M), and evaluating the inequality above. If the inequality is not satisfied, an iterative process may be performed, in which S is incremented upward and the inequality is evaluated again. This iterative process may be limited by an iteration limit (e.g., the square root of M), to prevent the calculation of a number of iterations that is too high to be useful.

Figure 9:
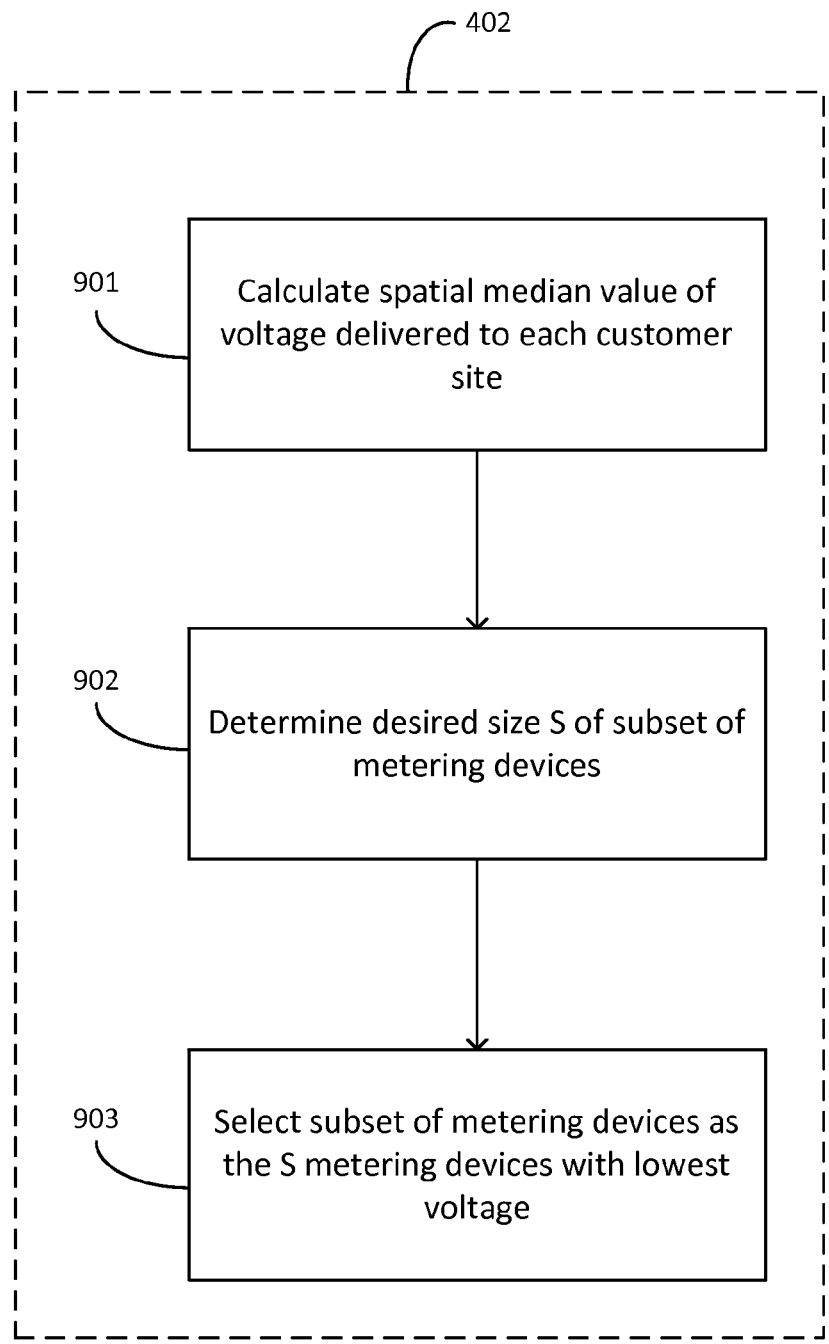
FIG. 9 is an example flow chart of a process for optimizing voltage, in accordance with an embodiment.
Figure 10:
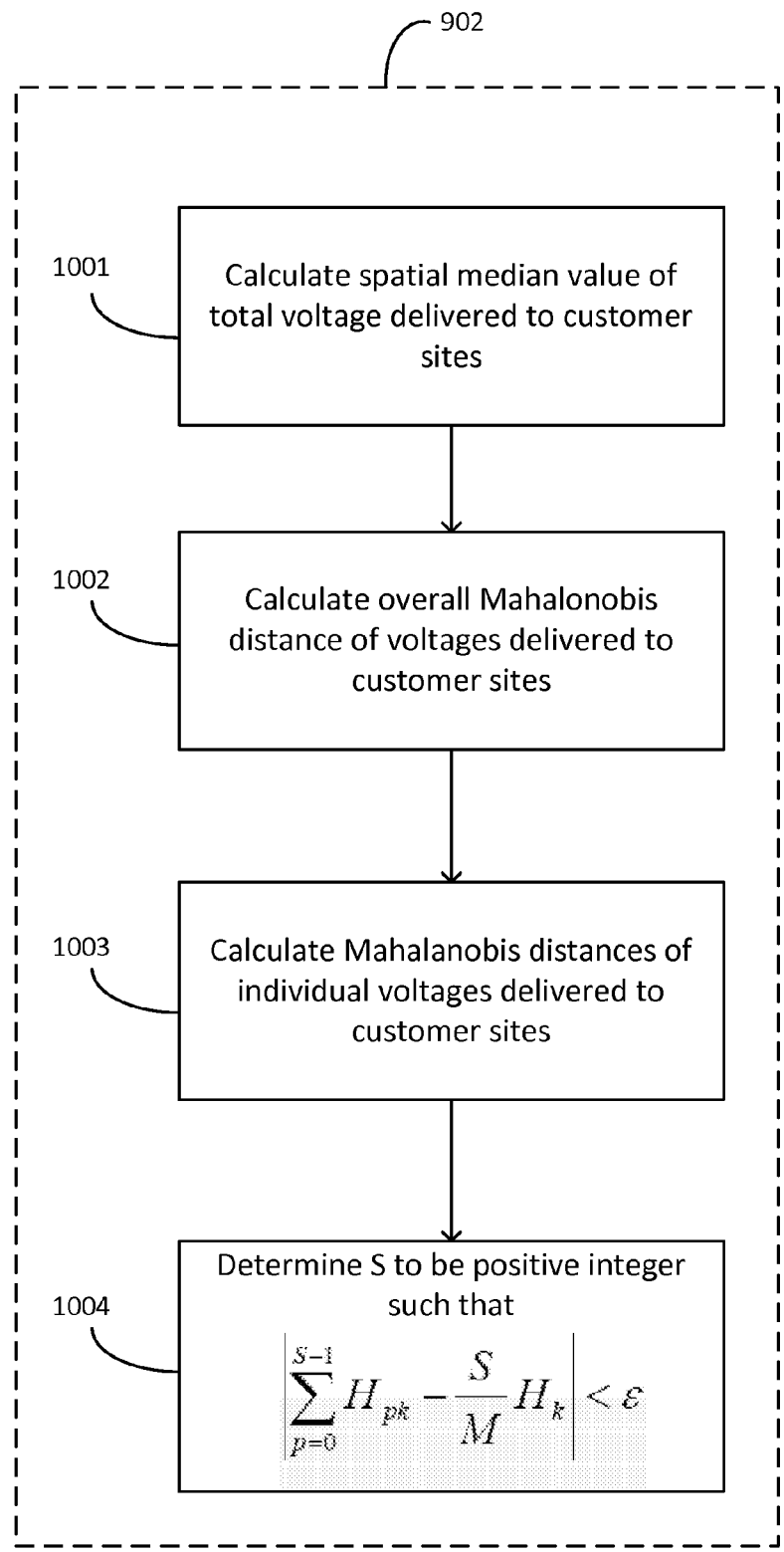
FIG. 10 is an example flow chart of a process for optimizing voltage, in accordance with an embodiment.

Having determined a value of S, the sub-process of FIG. 10 returns to the sub-process of FIG. 9, which continues at block 903, where the voltage optimization system selects a subset of the metering devices as being the S metering devices which caused the inequality above to be satisfied. If the voltage optimization system has sorted the metering devices as described above, the set of metering devices to be analyzed will now simply be the first S metering devices in the sorted list, which have the lowest associated voltages by virtue of the pre-sorting. In other embodiments, a different set of S metering devices also may be selected that is not necessarily strictly the ones having the smallest values. For example, the metering devices may not be pre-sorted, or may be sorted according to another metric such as mean, expected value, median, etc.

Having selected a subset of the metering devices, the sub-process of FIG. 9 returns to the process of FIG. 4, which continues at block 403, where the voltage optimization system generates a control signal to control operation of the power controllers in the network. This may be performed, e.g., by applying an appropriate voltage management algorithm to determine the appropriate actions to be performed by the power controllers.

One embodiment employing the process described above is further illustrated below in pseudocode. Pseudocode block 5 describes the calculation of certain quantities relating to the metering sites and the higher-level calculations performed in selecting and using a subset of the metering sites. Pseudocode block 6 describes further details of how the subset of the metering sites is determined according to this embodiment.

```
<Begin pseudocode block 5>
For each analysis interval k , 0 ≤ k < K
{
  Estimate median φ̂_k and Mahalanobis distance H_k for the entire
population of metering sites
  For each metering site m , 0 ≤ m < M
  {
    Estimate spatial median φ̂_mk and Mahalanobis distance H_mk
  }
  Sort the M metering sites by ascending φ̂_mk , assigning sort index p such
that
    φ̂_0k < φ̂_1k < ... < φ̂_pk < ... < φ̂_(M−1)k , 0 ≤ p < M
  Choose a subset of observations of size S < M such that
```

$$\left| \sum_{p=0}^{S-1} H_{pk} - \frac{S}{M} H_k \right| < \varepsilon$$

```
  Apply the subset thus selected in an appropriate voltage management
algorithm
}
<End pseudocode block 5>
```

<Begin pseudocode block 6>
Algorithm for observation subset selection, appropriate for M > 100
Set initial nearest integer $S = \sqrt{M}$.
Set iteration limit $I = 0$.

Set initial modified Mahalanobis distance error as $\varepsilon_S = \left| \sum_{p=0}^{S-1} H_{pk} - \frac{S}{M} H_k \right|$.

While $\{\varepsilon_S \geq \epsilon$ and $I \leq \sqrt{M}\}$
{
  $I = I + 1$
  $S = S + 1$ Compute $\varepsilon_S = \left| \sum_{p=0}^{S-1} H_{pk} - \frac{S}{M} H_k \right|$
}

Compute $\hat{\varphi}_S = \frac{1}{S} \sum_{p=0}^{S-1} \hat{\varphi}_{pk}$

<End pseudocode block 6>

While <pseudocode block 6> provides one example of an iteration limit (e.g., $\{\varepsilon_S \geq \epsilon$ and $I \leq \sqrt{M}\}$), various embodiments can use different iteration limits or iteration techniques. For example, the iteration limit can be set to half of M, two-thirds of M, a fraction times the square root of M, the square root of M plus a predetermined number or variable, or range from a minimum iteration limit to a maximum iteration limit. In other embodiments, the iteration limit may be determined based on a statistical formula or satisfying a condition.

Use of mean, median, spatial median, variance, dispersion, Mahalanobis distances, etc. have been disclosed and discussed above. It is to be appreciated that the principles described herein are not limited to the use of these metrics alone. Other similar methods may be formulated using statistics appropriate for the population of interest, comprising in this case the signals originating at the metering sites. There may be changes to the formulation of $\{\varepsilon_S$ and $I\}$ some cases, as will be appreciated by those skilled in the art.

Conclusion

The above-described systems and methods can be implemented in digital electronic circuitry, in computer hardware, firmware, and/or software. The implementation can be as a computer program product (e.g., a computer program tangibly embodied in an information carrier). The implementation can, for example, be in a machine-readable storage device, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the disclosure by operating on input data and generating output. Method steps can also be performed by and an apparatus can be implemented as special purpose logic circuitry. The circuitry can, for example, be a FPGA (field programmable gate array) and/or an ASIC (application specific integrated circuit). Modules, subroutines, and software agents can refer to portions of the computer program, the processor, the special circuitry, software, and/or hardware that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a viewer, the above described techniques can be implemented on a computer having a display device. The display device can, for example, be a cathode ray tube (CRT) and/or a liquid crystal display (LCD) monitor. The interaction with a viewer can, for example, be a display of information to the viewer and a keyboard and a pointing device (e.g., a mouse or a trackball) by which the viewer can provide input to the computer (e.g., interact with a viewer interface element). Other kinds of devices can be used to provide for interaction with a viewer. Other devices can, for example, be feedback provided to the viewer in any form of sensory feedback (e.g., visual feedback, auditory feedback, or tactile feedback). Input from the viewer can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computer having a graphical viewer interface, a Web browser through which a viewer can interact with an example implementation, and/or other graphical viewer interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computers and having a client-server relationship to each other.

The communication network can include, for example, a packet-based network and/or a circuit-based network. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

The communication device can include, for example, a computer, a computer with a browser device, a telephone, an IP phone, a mobile device (e.g., cellular phone, personal digital assistant (PDA) device, laptop computer, electronic mail device), and/or other type of communication device. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a personal digital assistant (PDA).

The scope of the present disclosure is not limited by what has been specifically shown and described hereinabove. Those skilled in the art will recognize that there are suitable variations to the depicted examples of materials, configurations, constructions and dimensions. Numerous references, including patents and various publications, are cited and discussed in this disclosure. The citation and discussion of such references is provided merely to clarify the description of the present disclosure and is not an admission that any reference is prior art to the present disclosure. All references cited and discussed in this specification are incorporated herein by reference in their entirety.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While the present disclosure has been described in connection with the preferred embodiments of the various figures, it is to be understood that other similar embodiments may be used or modifications or additions may be made to the described embodiment for performing the same function of the present disclosure without deviating therefrom. Therefore, the present disclosure should not be limited to any single embodiment, but rather construed in breadth and scope in accordance with the recitation of the appended claims.

What is claimed is:

1. A method of providing voltage via a power distribution system comprising:
   receiving, by a computing device, delivered voltage information from each metering device of a plurality of sites, each metering device metering power distributed to each of the plurality of sites by at least one controller;
   determining, by the computing device based on the delivered voltage information for each of the plurality of sites, a number of metering devices to use to generate a control signal to control operation of the at least one controller distributing power to the plurality of sites;
   determining, by the computing device, an expected value of the delivered voltage information for each of the plurality of sites;
   selecting, by the computing device, at least the determined number of metering devices from the plurality of metering devices to form a subset of metering devices, the subset of metering devices corresponding to a subset of the plurality of sites that have a lowest expected value of the delivered voltage information; and
   using, by the computing device, the delivered voltage information of the subset of metering devices to generate the control signal to control operation of the at least one controller distributing power to the plurality of sites.

2. The method of claim 1, wherein the delivered voltage information includes a voltage measurement and a sample time associated with the voltage measurement.

3. The method of claim 1, further comprising:
   determining the number of metering devices to use to generate the control signal based on a variance of total delivered voltage to the plurality of sites and a variance difference threshold, the total delivered voltage based on the delivered voltage information for each of the plurality of sites.

4. The method of claim 1, further comprising:
   determining the number of metering devices to use to generate the control signal based on a dispersion of the total delivered voltage to the plurality of sites and an individual dispersion of the delivered voltage information for each of the plurality of metering devices.

5. The method of claim 1, further comprising:
   identifying a total number of metering devices of the plurality of sites; and
   determining the number of metering devices to use for the subset of metering devices based on a square root of the total number of metering devices.

6. A method of providing voltage via a power distribution system comprising:
   receiving, by a computing device, delivered voltage information from each metering device of a plurality of sites, each metering device metering power distributed to each of the plurality of sites by at least one controller;
   determining, b the computing device, a first covariance weighted distance for a total delivered voltage to the plurality of sites;
   determining, b the computing device, a second covariance weighted distance for each of the plurality of sites based on the delivered voltage information from each of the metering devices;
   determining, b the computing device, a number of metering devices to use for the subset of metering devices based on the first covariance weighted distance, the second covariance weighted distance, and a variance difference threshold, the number of metering devices used to generate a control signal to control operation of the at least one controller distributing power to the plurality of sites;
   selecting, by the computing device, at least the determined number of metering devices from the plurality of metering devices to form a subset of metering devices, the subset of metering devices corresponding to a subset of the plurality of sites and selected based on the delivered voltage information; and
   using, by the computing device, the delivered voltage information of the subset of metering devices to generate the control signal to control operation of the at least one controller distributing power to the plurality of sites.

7. The method of claim 6, wherein the variance difference threshold comprises an error margin for an estimate of a sample-size dependent variance ratio.

8. The method of claim 1, further comprising:
   determining the number of metering devices for the subset of metering devices based on the expected value.

9. A method of providing voltage via a power distribution system comprising:

receiving, by a computing device, delivered voltage information from each metering device of a plurality of sites, each metering device metering power distributed to each of the plurality of sites by at least one controller;

determining, based on the delivered voltage information for each of the plurality of sites, a number of metering devices to use to generate a control signal to control operation of the at least one controller distributing power to the plurality of sites;

determining a median value for each of the plurality of sites based on the delivered voltage information from each of the metering devices;

selecting, by the computing device, at least the determined number of metering devices from the plurality of metering devices to form a subset of metering devices, the subset of metering devices corresponding to a subset of the plurality of sites that have a lowest median value of the delivered voltage information to form the subset of the metering devices; and using, by the computing device, the delivered voltage information of the subset of metering devices to generate the control signal to control operation of the at least one controller distributing power to the plurality of sites.

10. The method of claim 9, further comprising:
determining a spatial median value for each of the plurality of sites based on the delivered voltage information from each of the metering devices; and
selecting one or more metering devices of the plurality of sites that have a lowest spatial median value to form the subset of the metering devices.

11. The method of claim 1, further comprising:
transmitting, via the computing device, the generated control signal to the at least one controller of the plurality of sites.

12. A system to control voltage in a power distribution system comprising:
a computing device including at least one processor configured to:
receive delivered voltage information from each metering device of a plurality of sites, each metering device metering power distributed to each of the plurality of sites by at least one controller;
determine, based on the delivered voltage information for each of the plurality of sites, a number of metering devices to use to generate a control signal to control operation of the at least one controller distributing power to the plurality of sites;
determine an expected value of the delivered voltage information for each of the plurality of sites;
select at least the determined number of metering devices from the plurality of metering devices to form a subset of metering devices, the subset of metering devices corresponding to a subset of the plurality of sites that have a lowest expected value of the delivered voltage information; and
use the delivered voltage information of the subset of metering devices to generate the control signal to control operation of the at least one controller distributing power to the plurality of sites.

13. The system of claim 12, wherein the delivered voltage information includes a voltage measurement and a sample time associated with the voltage measurement.

14. The system of claim 12, wherein the computing device is further configured to:

determine the number of metering devices to use to generate the control signal based on a variance of total delivered voltage to the plurality of sites and a variance difference threshold, the total delivered voltage based on the delivered voltage information for each of the plurality of sites.

15. The system of claim 12, wherein the computing device is further configured to:
determine the number of metering devices to use to generate the control signal based on a dispersion of the total delivered voltage to the plurality of sites and an individual dispersion of the delivered voltage information for each of the plurality of metering devices.

16. The system of claim 12, wherein the computing device is further configured to:
identify a total number of metering devices of the plurality of sites; and
determine the number of metering devices to use for the subset of metering devices based on a square root of the total number of metering devices.

17. The system of claim 12, wherein the computing device is further configured to:
determine a first covariance weighted distance for a total delivered voltage to the plurality of sites;
determine a second covariance weighted distance for each of the plurality of sites based on the delivered voltage information from each of the metering devices; and
determine the number of metering devices to use for the subset of metering devices based on the first covariance weighted distance, the second covariance weighted distance, and a variance difference threshold.

18. The system of claim 17, wherein the variance difference threshold comprises an error margin for an estimate of a sample-size dependent variance ratio.

19. The system of claim 12, wherein the computing device is further configured to:
determine the number of metering devices for the subset of metering devices based on the expected value.

20. The system of claim 12, wherein the computing device is further configured to:
determine a median value for each of the plurality of sites based on the delivered voltage information from each of the metering devices; and
select one or more metering devices of the plurality of sites that have a lowest median value of the delivered voltage information to form the subset of the metering devices.

21. The system of claim 12, wherein the computing device is further configured to:
determine a spatial median value for each of the plurality of sites based on the delivered voltage information from each of the metering devices; and
select one or more metering devices of the plurality of sites that have a lowest spatial median value to form the subset of the metering devices.

22. The system of claim 12, wherein the computing device is further configured to:
transmit the generated control signal to the at least one controller of the plurality of sites.

* * * * *